US008093095B2

(12) United States Patent
Basu et al.

(10) Patent No.: US 8,093,095 B2
(45) Date of Patent: Jan. 10, 2012

(54) SEMICONDUCTOR DEVICE WITH A BULK SINGLE CRYSTAL ON A SUBSTRATE

(75) Inventors: Arnab Basu, Belmont (GB); Max Robinson, Shincliffe (GB); Ben Cantwell, Chester-le-street (GB); Andy Brinkman, Durham (GB)

(73) Assignee: Kromek Limited, Sedgefield (GB)

( * ) Notice: Subject to any disclaimer, the term of this patent is extended or adjusted under 35 U.S.C. 154(b) by 282 days.

(21) Appl. No.: 12/158,111

(22) PCT Filed: Dec. 21, 2006

(86) PCT No.: PCT/GB2006/004868
§ 371 (c)(1),
(2), (4) Date: Aug. 1, 2008

(87) PCT Pub. No.: WO2007/072024
PCT Pub. Date: Jun. 28, 2007

(65) Prior Publication Data
US 2008/0315342 A1 Dec. 25, 2008

(30) Foreign Application Priority Data
Dec. 21, 2005 (GB) .................................. 0526072.4

(51) Int. Cl.
*H01L 21/00* (2006.01)
(52) U.S. Cl. ........... 438/93; 257/78; 257/414; 257/428; 257/431; 257/442; 257/613; 257/614; 257/E27.14; 257/E27.146; 257/E31.003; 257/E31.015; 257/E31.086; 257/E31.092; 438/48; 438/56; 438/57

(58) Field of Classification Search .................. 257/414, 257/428, 431, 440, 442, 614, E31.015, E31.026, 257/78, 613, E27.14, E27.146, E31.003, 257/E31.086, E31.092; 438/48, 57, 84, 93, 438/56
See application file for complete search history.

(56) References Cited

U.S. PATENT DOCUMENTS

| 4,689,650 A | 8/1987 | Dinan |
| 4,699,688 A | 10/1987 | Shastry |
| 4,710,794 A | 12/1987 | Koshino et al. |
| 4,826,784 A | 5/1989 | Salerno et al. |

(Continued)

FOREIGN PATENT DOCUMENTS
DE 197 11 849 A1 9/1998
(Continued)

OTHER PUBLICATIONS

Yasuda et al., "Development of Nuclear Radiation Detectors With Energy Discrimination Capabilities Based on Thick CdTe Layers Grown by Metalorganic Vapor Phase Epitaxy", IEEE Transactions on Nuclear Science 52 (2005) pp. 1951-1955.*

(Continued)

*Primary Examiner* — Jay C Kim
(74) *Attorney, Agent, or Firm* — Popovich, Wiles & O'Connell, P.A.

(57) ABSTRACT

Device and method of forming a device in which a substrate (10) is fabricated with at least part of an electronic circuit for processing signals. A bulk single crystal material (14) is formed on the substrate, either directly on the substrate (10) or with an intervening thin film layer or transition region (12). A particular application of the device is for a radiation detector.

11 Claims, 2 Drawing Sheets

U.S. PATENT DOCUMENTS

| | | | |
|---|---|---|---|
| 4,965,649 | A | 10/1990 | Zanio et al. |
| 4,970,567 | A | 11/1990 | Ahlgren et al. |
| 5,306,386 | A | 4/1994 | de Lyon |
| 5,373,182 | A * | 12/1994 | Norton ............ 257/440 |
| 5,389,792 | A | 2/1995 | DiMarzio et al. |
| 5,581,117 | A | 12/1996 | Kawano |
| 5,814,149 | A | 9/1998 | Shintani et al. |
| 5,838,053 | A | 11/1998 | Bevan et al. |
| 5,861,626 | A | 1/1999 | Chandra et al. |
| 6,127,203 | A | 10/2000 | Wan et al. |
| 6,281,039 | B1 | 8/2001 | Marion |
| 6,468,882 | B2 | 10/2002 | Motoki et al. |
| 6,733,591 | B2 | 5/2004 | Anderson |
| 6,784,085 | B2 | 8/2004 | Cuomo et al. |
| 6,890,809 | B2 | 5/2005 | Karpov et al. |
| 6,906,331 | B2 | 6/2005 | Choo et al. |
| 7,289,336 | B2 * | 10/2007 | Burdick et al. ............ 361/803 |
| 2002/0028564 | A1 | 3/2002 | Motoki et al. |
| 2003/0024471 | A1 | 2/2003 | Talin et al. |
| 2003/0034500 | A1 | 2/2003 | Demkov et al. |
| 2003/0049898 | A1 | 3/2003 | Karpov et al. |
| 2004/0183023 | A1 | 9/2004 | Choo et al. |
| 2005/0183658 | A1 | 8/2005 | Nakahata et al. |
| 2005/0247260 | A1 | 11/2005 | Shin et al. |
| 2006/0011135 | A1 | 1/2006 | Dmitriev et al. |
| 2009/0053453 | A1 | 2/2009 | Basu et al. |

FOREIGN PATENT DOCUMENTS

| | | |
|---|---|---|
| EP | 0 343 738 A2 | 11/1989 |
| EP | 1 019 568 B1 | 6/2002 |
| EP | 1 691 422 A1 | 8/2006 |
| FR | 2 612 335 A1 | 9/1988 |
| FR | 2 852 146 A1 | 9/2004 |
| JP | 61205693 A | 9/1986 |
| JP | 5315582 A | 11/1993 |
| JP | 2001200366 A | 7/2001 |
| WO | WO 95/31824 A1 | 11/1995 |
| WO | WO 02/44443 A1 | 6/2002 |
| WO | WO 02/067014 A1 | 8/2002 |
| WO | WO 2005/053038 A1 | 6/2005 |
| WO | WO 2005/060011 A1 | 6/2005 |

OTHER PUBLICATIONS

Hong et al., "Growth and Photoconductor Properties of HgCdTe Epilayers Grown by Hot Wall Epitaxy Method," Journal of Crystal Growth, 240(1-2):135-141 (2002).

Bhat et al., "Growth of (100) Oriented CdTe on Si Using Ge as a Buffer Layer," Appl. Phys. Lett., 64(5):566-568 (1994).

Kim et al., "Structural and Optical Properties of a Strained CdTe/GaAs Heterostructure Grown by Temperature-Gradient Vapor Transport Deposition at Low Temperature," Thin Solid Films, 259(2):253-258 (1995).

Lalev et al., "Hot Wall Epitaxy of High-Quality CdTe/Si(111)," Journal of Crystal Growth, 256(1-2):20-26 (2003).

Leo et al., "Influence of a ZnTe Buffer Layer on the Structural Quality of CdTe Epilayers Grown on (100) GaAs by Metalorganic Vapor Phase Epitaxy," J. Vac. Sci. Technology B, 14(3):1739-1744 (May/Jun. 1996).

Rujirawat et al., "High Quality Large-Area CdTe(211)B on Si(211) Grown by Molecular Beam Epitaxy," Appl. Phys. Lett., 71(13):1810-1812 (1997).

Mar. 13, 2007 International Search Report for PCT/GB2006/004868 (2 pages).

May 31, 2006 UK Search Report for Patent Application No. GB0526072.4 (1 page).

May 4, 2007 International Search Report for PCT/GB2006/004864 (3 pages).

May 11, 2006 UK Search Report for Patent Application No. GB0526070.8 (1 page).

Mar. 30, 2006 UK Search Report for Patent Application No. GB0526073.2 (1 page).

May 31, 2006 UK Search Report for Patent Application No. GB0526075.7 (1 page).

May 7, 2007 International Search Report for PCT/GB2006/004859 (2 pages).

Abstract for DE 197 11 849 A1 (1 page).

Abstract for FR 2 612 335 A1 (1 page).

Abstract for FR 2 852 146 A1 (1 page).

Abstract for JP 61205693 A (1 page).

Abstract for JP 5315582 A (1 page).

Abstract for JP 2001200366 A (1 page).

Abstract for WO 2005/053038 A1 (1 page).

Abstract for WO 2005/060011 A1 (1 page).

Blue, M.D., "Optical Absorption in HgTe and HgCdTe," Physical Review, vol. 134, No. 1A, A226-A234 (1964).

* cited by examiner

SEMICONDUCTOR DEVICE WITH A BULK SINGLE CRYSTAL ON A SUBSTRATE

FIELD OF THE INVENTION

The present invention relates to a method of interconnecting a device, in particular for interconnecting a crystal material used for detection of radiation. The invention also relates to a device made in accordance with the method.

DISCUSSION OF THE PRIOR ART

It is well known that certain materials, in particular single bulk crystal semiconductor materials such as cadmium telluride and cadmium zinc telluride, can be used to detect radiation, including x-rays and gamma rays. When high energy photons collide with such materials, they are absorbed by the materials, and generate an electrical signal. By detecting the electrical signal, the incident radiation can be detected.

The formation of such known detectors generally requires the provision of a bulk single crystal material to be used as the detector. An array of electrodes, for example in the form of a pixelated electrode structure, is formed onto the rear surface of the crystal material. The individual electrodes forming the pixelated electrode structure are then connected to electronic circuits for processing the generated electrical signals. The connections between the pixelated electrode structure and the electronic processing circuits can be achieved using conventional semiconductor connection techniques, including wire bonding and through solder bumps.

It will be appreciated that for improved detection accuracy and resolution, it is necessary that the electrode structure provides a fine array of electrodes, and accordingly a large number of electrical connections are required to connect the electrodes to the processing circuitry. Accordingly, the electrical connection of the electrode structure to the electronic circuitry may be a time-consuming and delicate operation.

Where the electrical connection fails, for example where the wires or solder bumps are not properly connected to the electrode structure, or where they fail over time, there is a resulting degradation of the performance of the detector array.

SUMMARY OF THE INVENTION

According to a first aspect of the present invention, a method of forming a device comprises fabricating a substrate with at least part of an electronic circuit for processing signals, and depositing a bulk single crystal material on the substrate. The bulk single crystal material may be deposited on the substrate either before or after fabrication of the electronic circuit in the substrate.

In a preferred example, the device is a radiation detector. In this case, the bulk single crystal material is one selected for detection of the radiation to be detected. The bulk crystal material will absorb photons and generate electrical signals responsive to the absorbed photons for processing by the electronic circuit.

By including at least part of the electronic circuit for processing signals in the substrate on which the bulk single crystal material is formed, it is not necessary to form electrical connections between the bulk crystal material and the electronic circuit that processes the electrical signals. In the case of a detector, this means that the step of forming an electrode array on the detector material for capturing the electrical signals, and the connection of this electrode array to a separate electronic circuit can be avoided. This reduces the number of steps required in the formation of the detector. Also, this reduces the number of connections which must be accurately made, and which could fail, which in either case would reduce the efficiency of the detector. Also, since there is no need to make manual interconnections, the resolution of the detector can be greatly increased.

According to a second aspect of the present invention there is provided a radiation detector device comprising a substrate fabricated with at least part of an electronic circuit for processing signals, and a bulk single crystal material formed directly onto the substrate, the bulk single crystal material being suited for absorbing incident photons and generating electrical signals in response, and the electronic circuit comprises at least part of a circuit for processing those electrical signals.

In a preferred example of the invention, the substrate is formed from a silicon or gallium arsenide material, which are widely available materials conventionally used for electronic circuits. Other materials could be used, including silicon carbide which is conventionally used for high power devices.

The electronic circuit may be formed in the substrate using known semiconductor fabrication techniques. For example, regions of the substrate may be doped using ion implantation or diffusion.

The substrate may be processed to include an application-specific integrated circuit to achieve the required signal processing. Such circuits can include a variety of components, including transistors, diodes, charge coupled devices, resistors and capacitors. The components may form amplifier, shaper, filter, discriminator and/or thresholding circuit elements. Metal contact regions can also be provided on the surface of the substrate that can be used to output the electrical signals both before or after processing. This enables the fabricated detector to be connected to other input or output devices.

It is preferred that the bulk single crystal material formed on the substrate after device fabrication is a bulk region of cadmium telluride, cadmium zinc telluride or cadmium manganese telluride. These materials are especially suited for absorption and thereby detection of high energy photons, for example x-rays or gamma rays. The thickness of the bulk single crystal material will depend upon the material used and the radiation to be detected.

Since the bulk single crystal material will generally be of a material different from the substrate, it is preferred that at least one intermediate layer and/or an interfacial region is provided between the substrate and the bulk single crystal material. The intermediate layer may be a thin film layer of the same or a similar material to the bulk crystal material, onto which the bulk crystal material me be grown. Alternatively, a stack of two or more layers may be provided which successively change from material similar to the underlying substrate to material similar to or the same as the bulk crystal material. Alternatively or additionally, an interfacial region can be formed in which there is a gradual change from a material similar to the substrate or an intermediate layer grown on the substrate to the material of the bulk crystal. In this case, the interfacial region and bulk crystal material may be formed in a single process using a physical vapour phase deposition method such as that disclosed in European patent EP-B-1019568. In this case, the substrate including at least part of the processing electronics is provided in a chamber, and a source material is provided as a vapour to be deposited on to the substrate. The parameters of growth are controlled so that the initially deposited region can be formed directly onto the substrate, with later deposited material being grown at a faster rate, and having the required crystal material structure for detection of photons. In all cases, the intermediate layer or layers and/or interfacial region help to overcome lattice or other mismatches between the substrate and the bulk crystal material. In particular, to grow a material onto an underlying substrate, it is advantageous that the lattice parameters of the materials are similar to minimise lattice mismatch. A silicon substrate will have a typical lattice parameter of a=5.4309 Å, whereas a cadmium telluride crystal material will have a typical lattice parameter of a=6.481 Å. Accordingly, it is difficult to form cadmium telluride directly onto a silicon substrate. However, by providing an interfacial region between the silicon substrate and cadmium telluride bulk crystal material, such variations in the lattice can be compensated for. For example, a series of intermediate layers, or gradually changing intermediate region can be formed with the lattice parameter varying between each layer from a lattice parameter approaching that of the substrate to that of the crystal material.

A metal layer may be provided on the detection material. In this case, the metal layer is formed after deposition of the detection material, and may be formed by thermal evaporation, e-beam evaporation, sputtering or similar means. Examples of suitable metals include indium, platinum, gold and aluminium.

BRIEF DESCRIPTION OF THE DRAWINGS

The present invention will now be described by way of example with reference to the accompanying drawings, in which.

DETAILED DESCRIPTION OF A PREFERRED EXAMPLE

The formation of a device according to the present invention begins with the formation of an electronic circuit in a substrate. A suitable substrate is a semiconductor substrate of gallium arsenide or silicon 10. This substrate can be processed in accordance with normal semiconductor fabrication techniques, such as doping using ion implantation, diffusion or lithography and the formation of metal contact regions 16 to create an application-specific integrated circuit (ASIC). The circuit will be designed so that electrical signals generated as a result of the absorption of photons in a crystal material can be suitably processed, for example to provide an indication of the number or energy level of the photons absorbed, or to provide other information relating to the detected photons. The circuit may include pre-amplification, filtering, shaping, thresholding and/or discriminating elements.

After fabricating the integrated circuit within the semiconductor substrate, a bulk single crystal material 14, such as a cadmium telluride or cadmium zinc telluride layer which is to act to detect the incident photons, is grown on the semiconductor substrate. It will be appreciated that the bulk single crystal material may be formed on the substrate prior to formation of the electronic circuit in the substrate, with the electronic circuit being formed in the substrate after formation of the bulk crystal material on the substrate.

Figure 1:
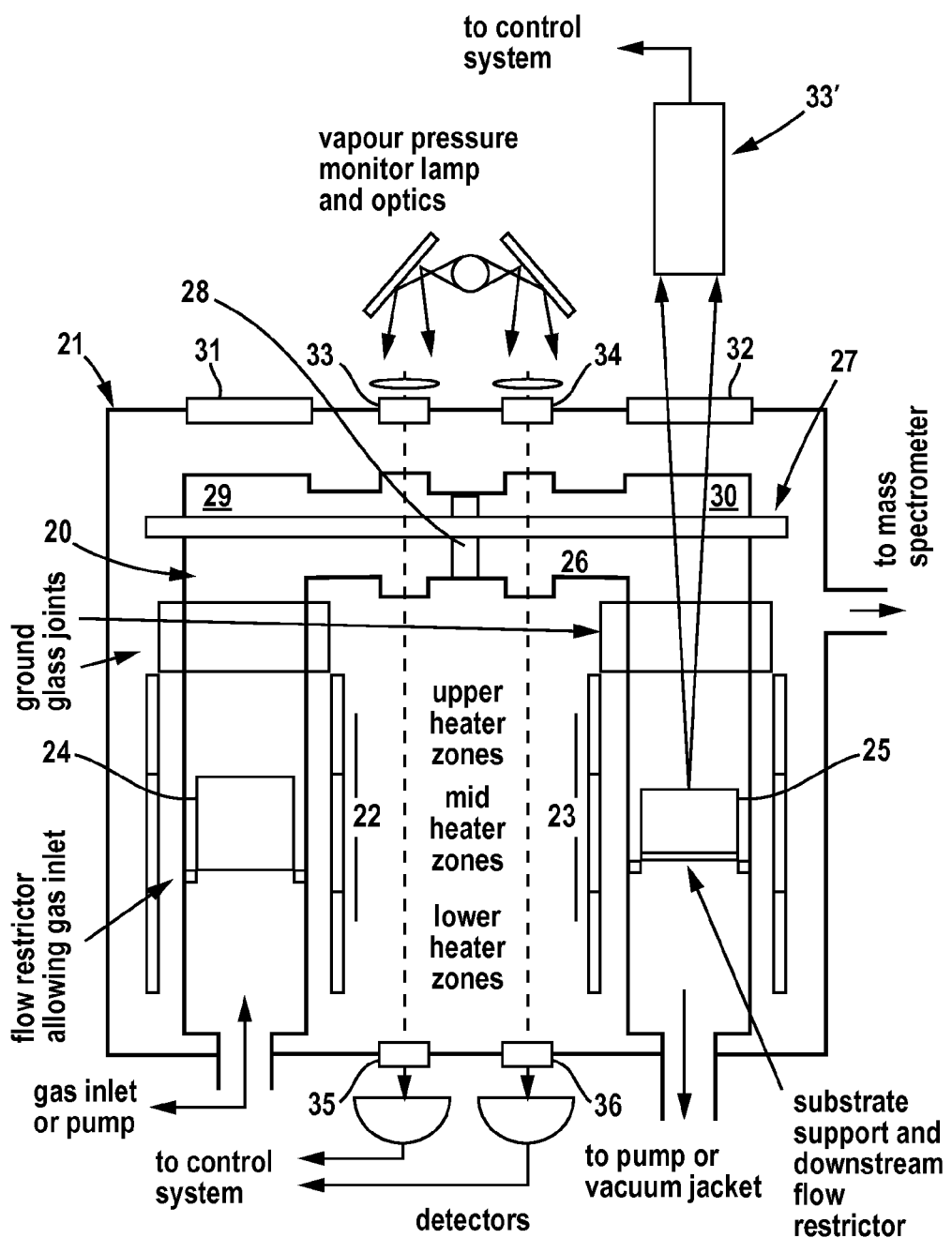
FIG. 1 shows an apparatus suitable for growing a bulk single crystal material on a substrate.

A preferred apparatus for the formation of the bulk single crystal material on the substrate is shown in FIG. 1. The apparatus comprises an evacuated U-tube in the form of a quartz envelope 20 encased in a vacuum jacket 21. Two separate three zone vertical tubular furnaces are provided 22, 23 for the source 24 and the sink zone 25 respectively. The source and sink zones are connected by an optically heated horizontal cross member 27 forming a passage 26. A flow restrictor 28—which may comprise a capillary or sintered quartz disk—is provided in the passage 26. The passage comprises two separate points of deviation, in each case at an angle of 90°, providing respective junctions between diverging passages for in-situ monitoring and vapour transport from the source to the sink zone. Windows allowing optical access to source and sink respectively are provided. The temperature of the surface of growing crystal in the sink zone can be monitored by a pyrometer or other optical diagnostic apparatus (33') located external to the vacuum jacket and in optical communication with the surface of the growing crystal. The diagnostic apparatus is in communication with a suitable control system to vary the sink zone temperature. The apparatus also comprises means for in-situ monitoring of vapour pressure by access ports 33 to 36 in the region of the flow restrictor 28, through which vapour pressure monitoring lamps and optics may be directed from a position external to the vacuum jacket with detectors located as shown at a location 35, 36 diametrically opposed with respect to the passage for vapour transport 26. These are suitably linked to a control system providing for process control.

The source tube, growth tube and cross member, in which transport takes place, are fabricated from quartz and the system is demountable with ground glass joints between the cross member and the two vertical tubes allowing removal of grown crystals and replenishment of source material. Radiation shields (not shown for clarity) together with the vacuum jacket which surrounds the entire system provide thermal insulation.

The substrate 10 is located on a quartz block in the growth tube with the gap between this glass block and the quartz envelope forming a downstream flow restrictor. Provision is made for a gas inlet to the source tube and the growth tube may be pumped by a separate pumping system or by connection to the vacuum jacket via a cool dump tube.

To enable growth and avoid mismatches between the detector material 14 and the substrate 10, it may be desirable to deposit one or more interfacial layers or regions 12 on the substrate 10 onto which the detector material 14 can be deposited. The materials for adjacent layers or regions are selected to ensure mismatches between the layers are minimised.

The silicon substrate will have a lattice parameter a=5.4309 Å. In this case, the initial material deposited on the substrate may be GaP which has a lattice parameter a=5.4506 Å. This lattice parameter is sufficiently close to that of the underlying silicon substrate that any lattice mismatch is minimised. The source material supplied to the growth chamber may be gradually altered so as to deposit a gallium arsenide intermediate layer. Gallium arsenide has a lattice parameter a=5.6533 Å. This is sufficiently close to the lattice parameter of the GaP layer as to minimise any lattice mismatch. The source material may again be controlled to deposit an intermediate layer of CdS which has a lattice parameter a=5.82 Å. After this, the source material may again be changed to deposit a transitional layer of CdSe having a lattice parameter a=6.05 Å, before finally changing the source material to deposit a bulk crystal material such as cadmium telluride which will have a lattice parameter a=6.481 Å.

Although lattice mismatches are one consideration for selecting materials for the interfacial region 12, other factors such as relative thermal expansion and electron tunneling/charge transportation may also be important.

During the formation of the interfacial region, the growth parameters are controlled such that the transitional region has a minimal thickness. However, once the transition has been made to the bulk crystal material to be deposited, the growth parameters can be adjusted so that the bulk crystal material can be deposited at a higher rate.

In one embodiment of the present invention, a bulk cadmium zinc telluride layer is formed on a silicon substrate. In this case, the silicon substrate is first treated to remove any oxides. This treatment may include chemical etching or heating the substrate to a high temperature in an ultra high vacuum. The silicon substrate is provided in the growth chamber, with separate sources of zinc telluride and cadmium telluride.

The preferred temperature for the growth of the crystal material is around 700° C., and accordingly the temperature of the silicon substrate is increased to this temperature. The temperature of the zinc telluride and cadmium telluride sources is then increased at a rate of about 2° C. per minute until the temperature of these reaches the same temperature as that of the substrate. Thereafter, the temperature of the cadmium telluride source is maintained at this level, whilst the temperature of the zinc telluride source is increased at the same rate to a temperature of around 870° C. When the zinc telluride source reaches a temperature of around 870° C., the temperatures of the substrate and source materials are maintained for around 5 hours. This causes the growth of an intermediate layer of zinc telluride to a thickness of around 50 microns on the substrate. Thereafter, the temperature of the substrate is maintained at around 700° C. and the temperature of the zinc telluride source is maintained at around 870° C. whilst the temperature of the cadmium telluride source is increased to the same temperature as the zinc telluride source material at a rate of around 2° C. per minute. As the cadmium telluride material is heated, the material layer grown on the substrate will gradually change composition from the zinc telluride material of the intermediate layer to a cadmium zinc telluride material with about 4% zinc. The resulting transition region will have a thickness of around 100 microns. The transition region could be reduced in thickness by increasing the rate of temperature increase of the cadmium telluride source, or could be made thicker by decreasing the rate of temperature increase. Thereafter, bulk crystal cadmium zinc telluride material will be deposited whilst the temperatures of the source materials are held at a higher temperature than the substrate. The precise composition of the deposited bulk crystal material can be controlled by varying the relative temperature of the two source materials.

Figure 2:
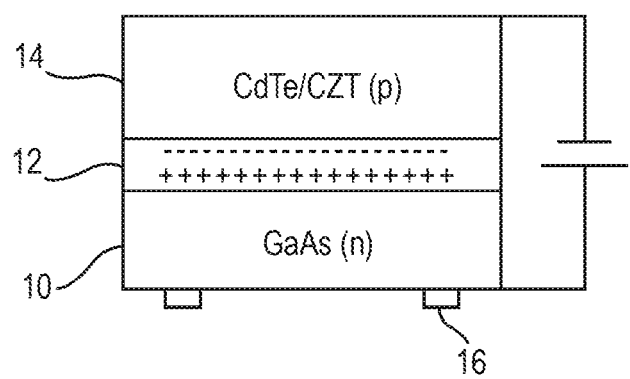
FIG. 2 shows a cross-section of a first example of a device made in accordance with the present invention; and, FIG. 3 shows a cross-section of a second example of a device made in accordance with the present invention.

One example of a device formed according to the present invention is shown in FIG. 2. As can be seen, electrical terminals or pads 16 are formed on the substrate 10 for electrical connection to other apparatus, for example to display apparatus. The electrical connections 16 can be formed by conventional techniques such as printing, sputtering or lithography. In the example shown in FIG. 2, the substrate 10, interfacial region 12 and bulk crystal material 14 form a p-i-n heterostructure. It will be appreciated that the junction can result in amplification of the generated electrons where the reverse bias is such as to create avalanche multiplication.

Figure 3:
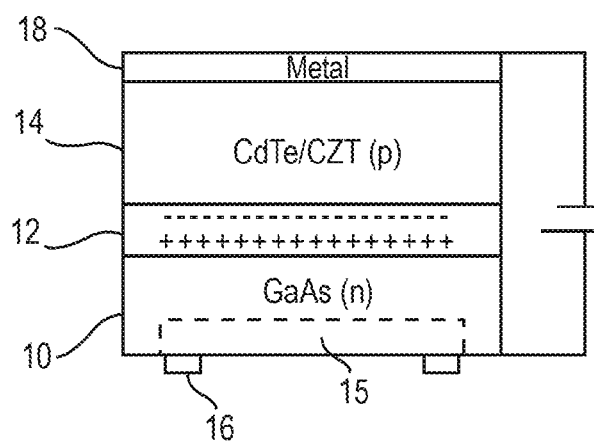

FIG. 3 shows an alternative example of the present invention in which a metal layer 18 is formed on the bulk crystal detecting layer 14. The resulting metal—bulk crystal—substrate structure will result in high energy electrons being injected over or tunnelling through the layer. In use, when radiation is incident upon the bulk crystal material 14, the photons from the radiation will be absorbed by the dense crystal material. The absorption of the photons converts these in to electrical signals which pass through the interfacial region 12 to the underlying semiconductor substrate detained there. The electrical signals received by the semiconductor substrate 10 are processed by the integrated circuit formed within the semiconductor substrate 10. Electronic circuit 15, including an application-specific integrated circuit, is positioned between electrical connections 16.

By forming a radiation detector by depositing the bulk single crystal material that acts to absorb the incident radiation directly onto the substrate including electronic circuitry that processes the electrons and/or holes generated within the bulk crystal material when the radiation is absorbed, much more accurate detection of the incident radiation is possible than where the electronic circuitry and detector material are formed separately and then joined together.

A particular problem which exists when electronic circuitry and detector material are formed separately, concerns the subsequent interconnection of the two. The method used for this, whether it is a wire bonding or bump bonding is rather unreliable and often leads to device failure, and often results in interconnection defects and lower efficiencies of device operations due to performance losses across the interconnection, and production yields of satisfactory devices are also often of lower yield.

Where the material is to be used for detection of radiation, the required thickness of the material will be dependent upon the energy to be absorbed. For cadmium telluride, cadmium zinc telluride and cadmium manganese telluride, the thickness of material required for absorption of radiation of various energies is as set out below:

| Photon Energy | Thickness required for 50% absorption |
|---|---|
| 30 keV | 0.007 cm |
| 100 keV | 0.07 cm |
| 200 keV | 0.35 cm |
| 500 keV | 1.2 cm |
| 750 keV | 1.7 cm |
| 1-10 MeV | 2.3-3.5 cm |

Although the present invention has been described with respect to a detector including a bulk crystal material for the detection of incident photons, it will be appreciated that the invention has applicability to other devices requiring electrical connection between a material and a substrate on which it is formed.

The invention claimed is:

1. A method of forming a device for detection of high energy photons comprising fabricating a substrate with at least part of an electronic circuit for processing electrical signals, and depositing a bulk single crystal material for absorbing the high energy photons and generating the electrical signals onto the substrate, the bulk single crystal material being deposited epitaxially such that the electrical signals generated within the bulk single crystal material can pass through to the underlying substrate to be processed by the electronic circuit within the substrate, in which the device is suitable for detection of x-rays, gamma rays, or both x-rays and gamma rays, and the bulk single crystal material is cadmium telluride, cadmium zinc telluride or cadmium manganese telluride.

2. The method according to claim 1, in which the bulk single crystal material is deposited on the substrate before fabrication of the electronic circuit in the substrate.

3. The method according to claim 1, in which the bulk single crystal material is deposited on the substrate after fabrication of the electronic circuit in the substrate.

4. The method according to claim 1, in which the substrate is formed from a silicon or gallium arsenide material.

5. The method according to claim 1, in which the electronic circuit is formed in the substrate by doping regions of the substrate using ion implantation, diffusion techniques, lithography or etching.

6. The method according to claim 1, in which the electronic circuit includes an application-specific integrated circuit.

7. The method according to claim 1, further including providing metal contact regions on a surface of the substrate that can be used to output processed electrical signals.

8. The method according to claim 1, including the step of forming an interfacial region between the substrate and the bulk single crystal material.

9. The method according to claim 8, in which the interfacial region is formed in a single process using a vapour phase deposition method.

10. The method according to claim 1, further comprising forming a metal layer on the bulk single crystal material.

11. The method according to claim 1, in which the bulk single crystal material is deposited to a thickness of from 0.007 cm to 3.5 cm.

* * * * *